(12) United States Patent
Yoshida et al.

(10) Patent No.: US 11,322,372 B2
(45) Date of Patent: May 3, 2022

(54) FLUID SUPPLY DEVICE AND LIQUID DISCHARGE METHOD OF THIS DEVICE

(71) Applicant: FUJIKIN INCORPORATED, Osaka (JP)

(72) Inventors: Toshihide Yoshida, Osaka (JP); Yukio Minami, Osaka (JP); Tsutomu Shinohara, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 206 days.

(21) Appl. No.: 16/635,002

(22) PCT Filed: Jul. 31, 2018

(86) PCT No.: PCT/JP2018/028620
§ 371 (c)(1),
(2) Date: Jan. 29, 2020

(87) PCT Pub. No.: WO2019/035351
PCT Pub. Date: Feb. 21, 2019

(65) Prior Publication Data
US 2020/0161147 A1 May 21, 2020

(30) Foreign Application Priority Data
Aug. 13, 2017 (JP) .............................. JP2017-156300

(51) Int. Cl.
*B01J 4/00* (2006.01)
*H01L 21/67* (2006.01)

(52) U.S. Cl.
CPC ........ *H01L 21/67034* (2013.01); *B01J 4/001* (2013.01)

(58) Field of Classification Search
CPC ......... H01L 21/67034; H01L 21/67017; H01L 21/027; H01L 21/304; B01J 4/001;
(Continued)

(56) References Cited

U.S. PATENT DOCUMENTS 6,960,242 B2 * 11/2005 Leitch .................... B01D 53/04
55/315.1
2011/0220152 A1 * 9/2011 Kitajima .................. F26B 3/00
134/26
(Continued)

FOREIGN PATENT DOCUMENTS

JP 2002-33302 1/2002
JP 2004-335675 11/2004
(Continued)

OTHER PUBLICATIONS

International Search Report issued in International Patent Application No. PCT/JP2018/028620, dated Oct. 30, 2018.
(Continued)

*Primary Examiner* — Huy Tram Nguyen
(74) *Attorney, Agent, or Firm* — Greenblum & Bernstein, P.L.C.

(57) ABSTRACT

A fluid supply device includes a condenser, a tank that stores the fluid, a pump that pressure-feeds the fluid toward a processing chamber, a main pipe connecting the tank and the pump and transferring the liquid stored in the tank to the pump using a weight of the liquid, and a discharging pipe that is connected to the main pipe at a lowest position of the main pipe at one end, is opened to the atmosphere at the other end, and vaporizes and discharges the liquid in the tank and the main pipe to the outside. The discharging pipe is formed so that, after the liquid in the tank and the main pipe is fully discharged, a liquid pool that separates a space on the atmosphere side and a space on the main pipe side of the discharging pipe is temporarily produced in the discharging pipe.

7 Claims, 6 Drawing Sheets

(58) Field of Classification Search
CPC .. B01J 4/008; B01J 4/00; B05B 12/00; B05C 11/10; B05C 3/00; B05D 3/00
USPC ........................................... 62/50.2
See application file for complete search history.

(56) References Cited

U.S. PATENT DOCUMENTS

2011/0289793 A1* 12/2011 Hayashi .................... F26B 3/04
 34/357
2015/0330954 A1 11/2015 Goto et al.

FOREIGN PATENT DOCUMENTS

| | | |
|---|---|---|
| JP | 2006-294662 | 10/2006 |
| JP | 2013-12538 | 1/2013 |
| JP | 2014-22520 | 2/2014 |
| JP | 2014-34027 | 2/2014 |
| JP | 2014-101241 | 6/2014 |
| WO | 2014/083639 | 6/2014 |

OTHER PUBLICATIONS

International Preliminary Report on Patentability issued in International Patent Application No. PCT/JP2018/028620, dated Feb. 18, 2020.

* cited by examiner

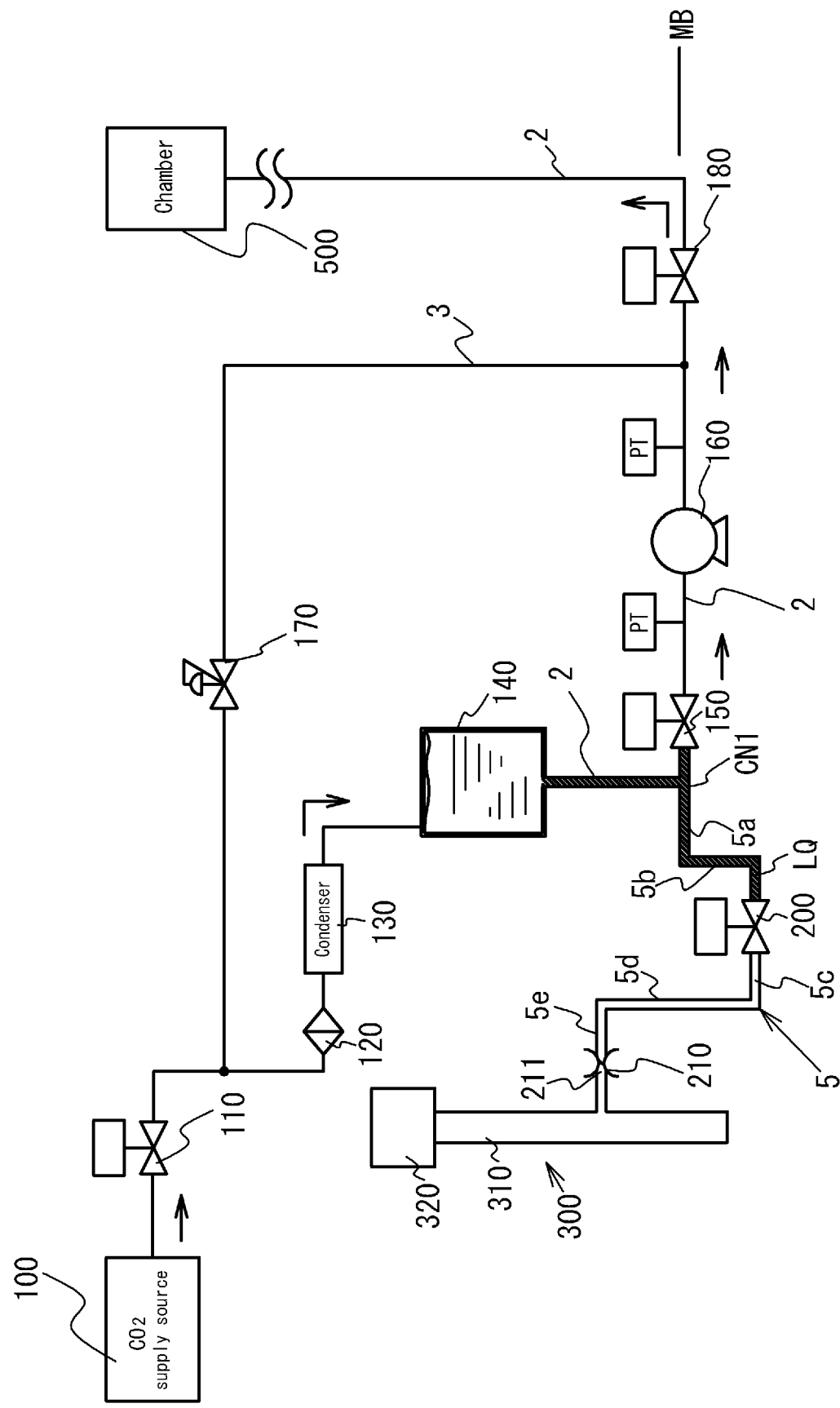
[fig.1]

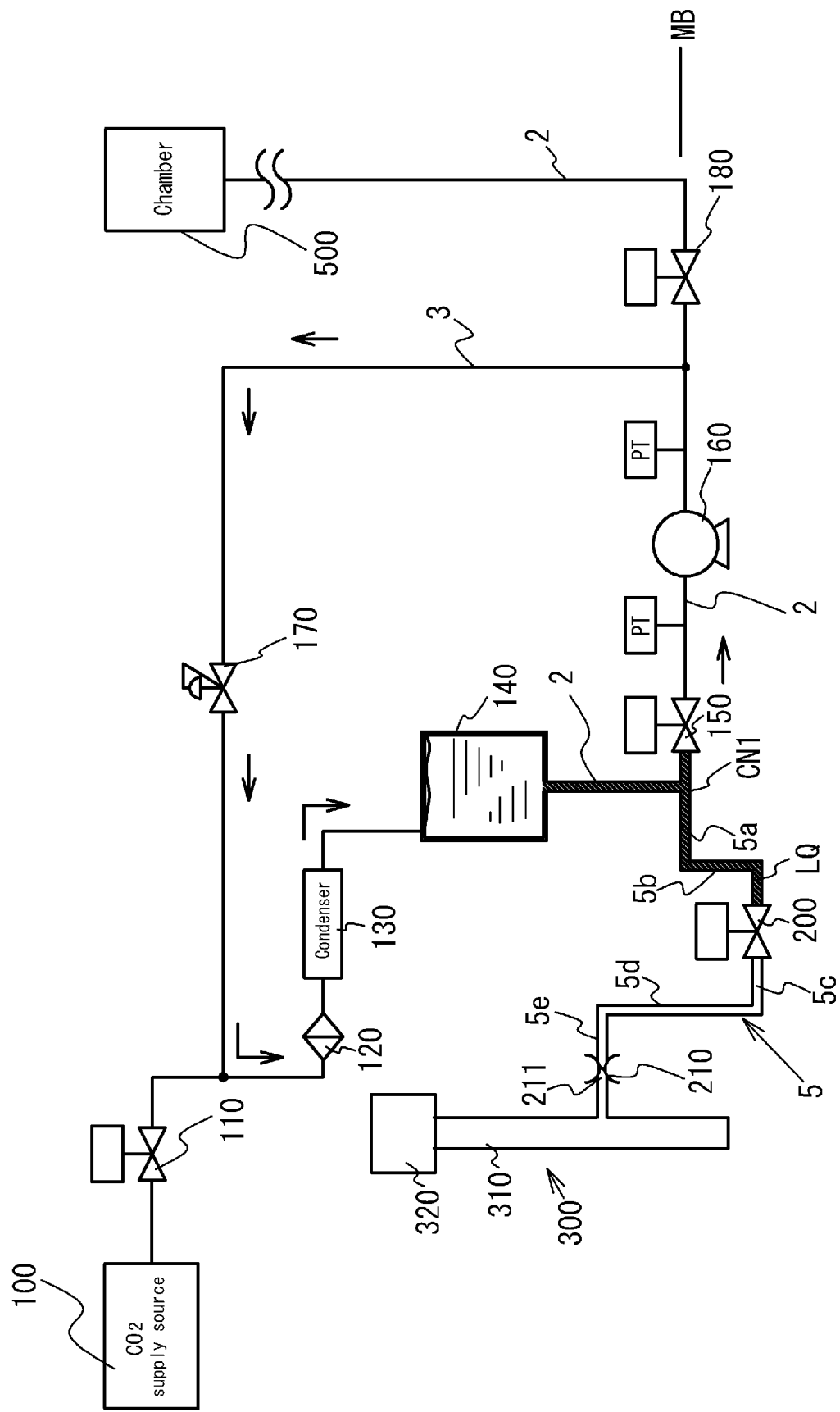
[fig.2]

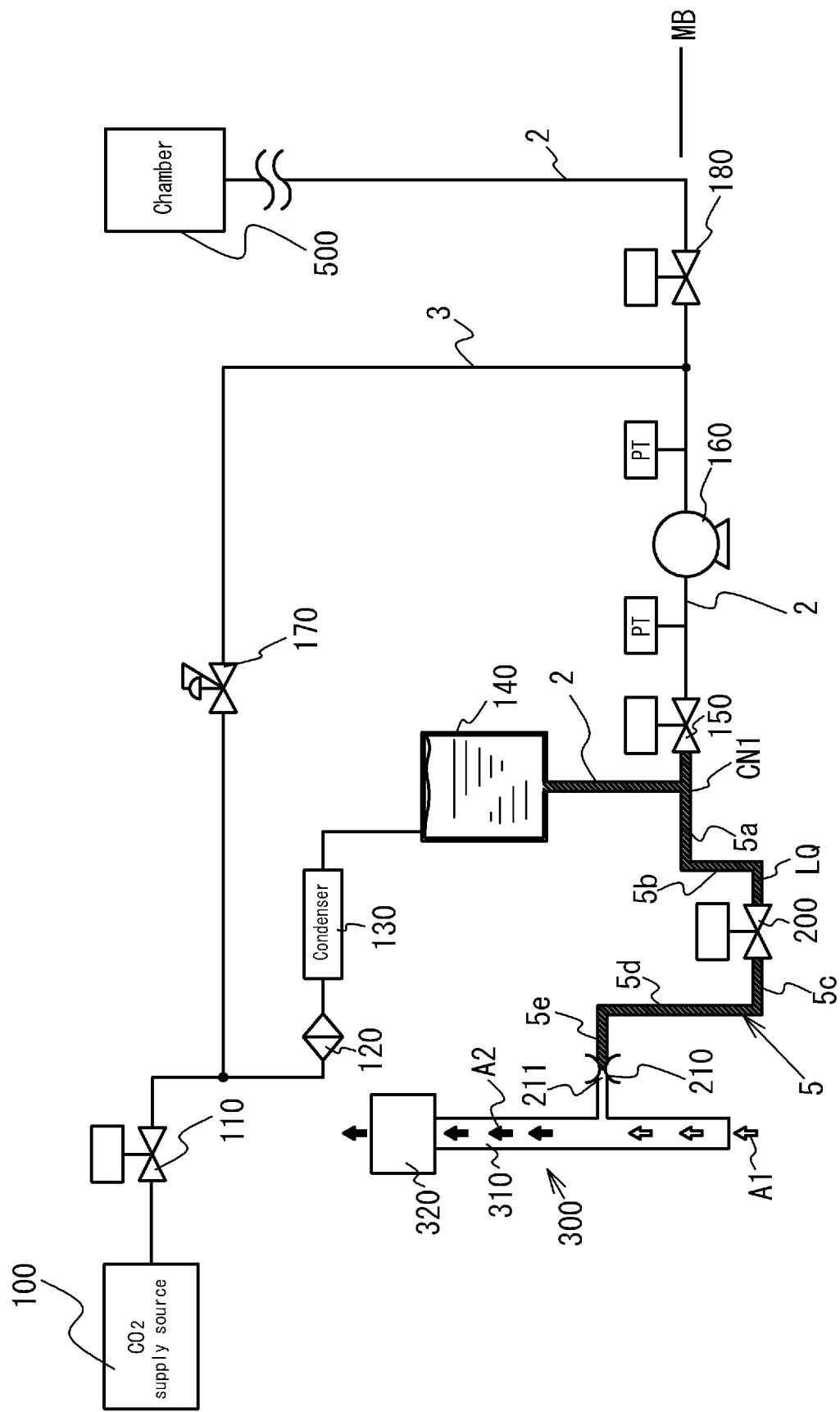
[fig.3]

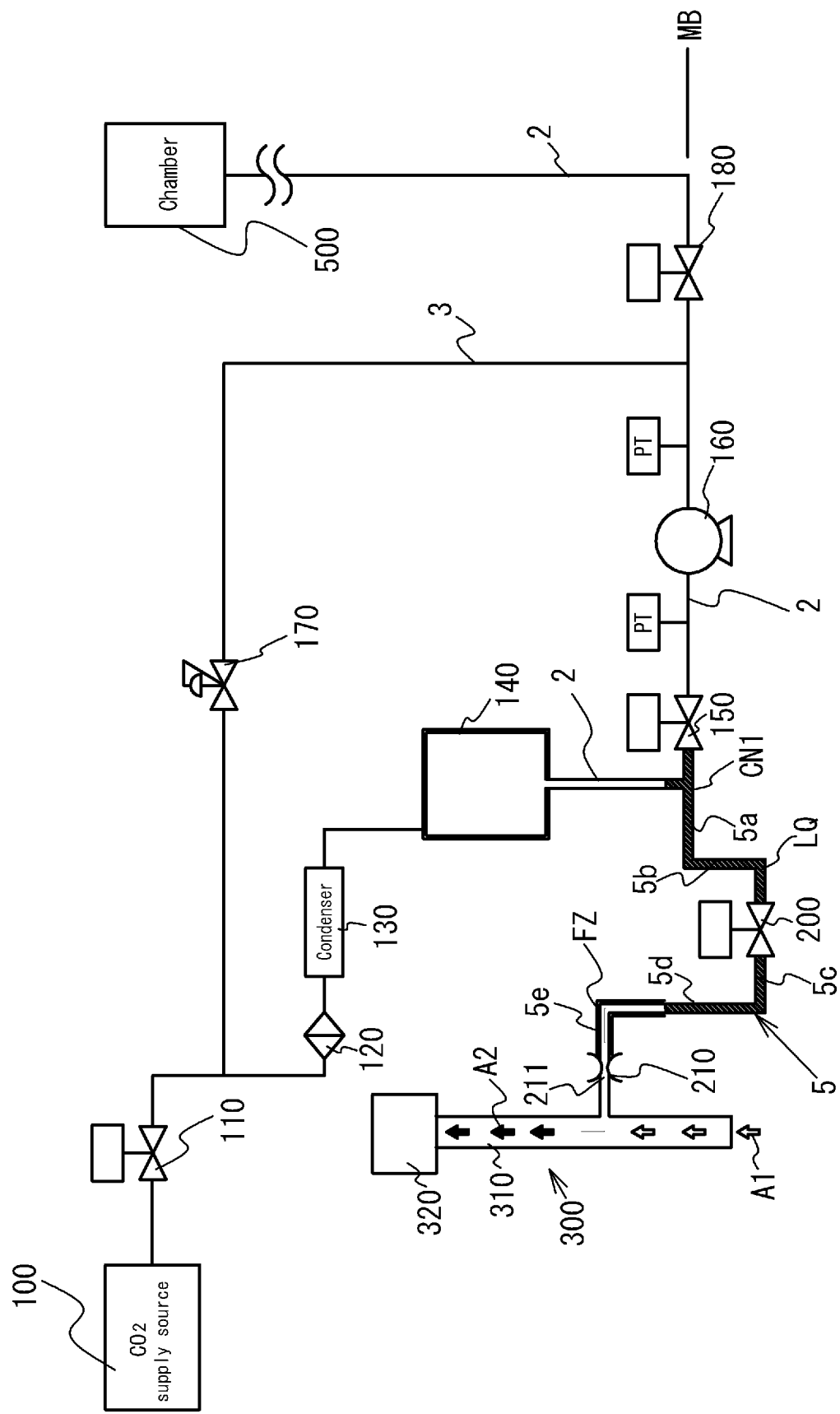
[fig.4]

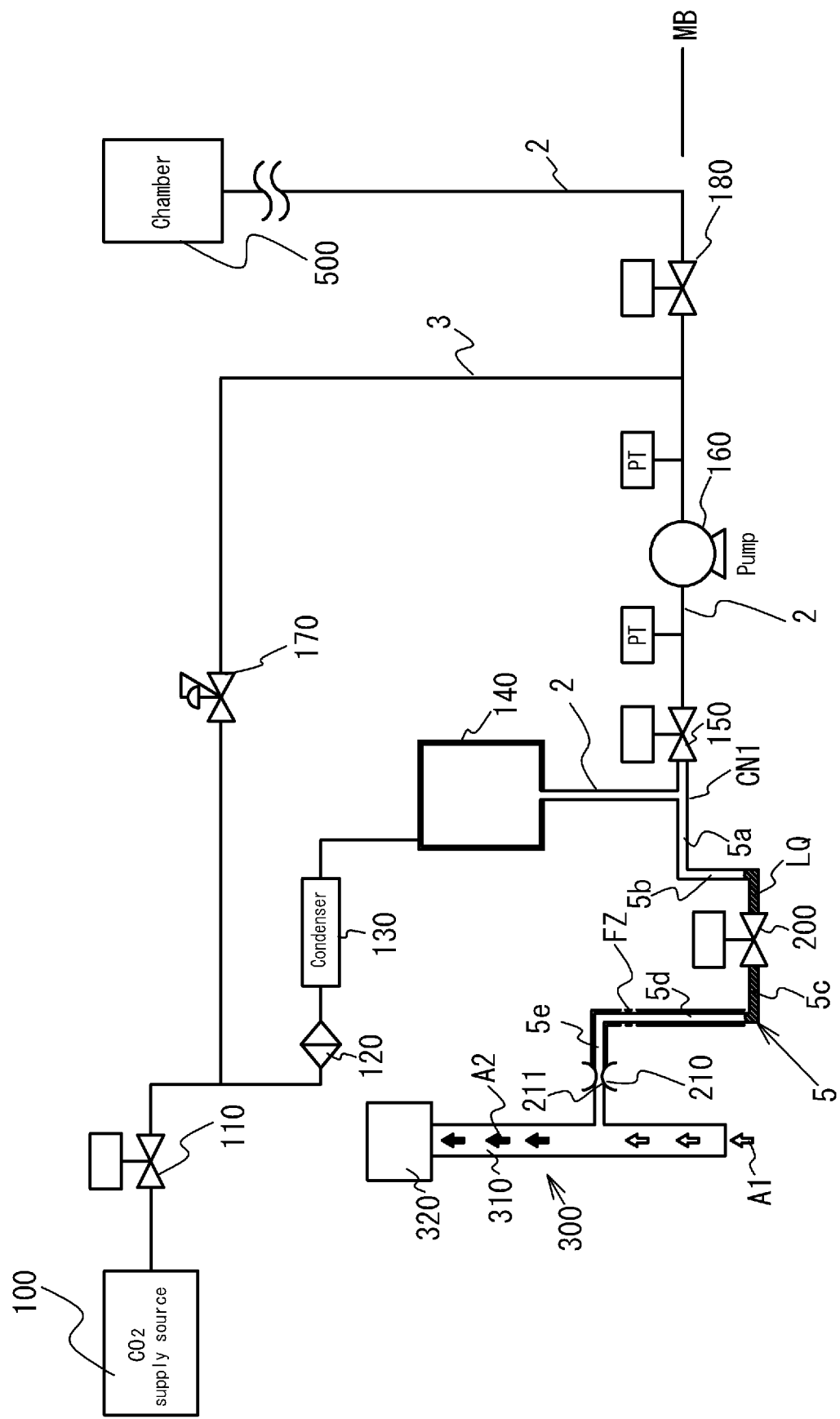
[fig.5]

[fig.6]
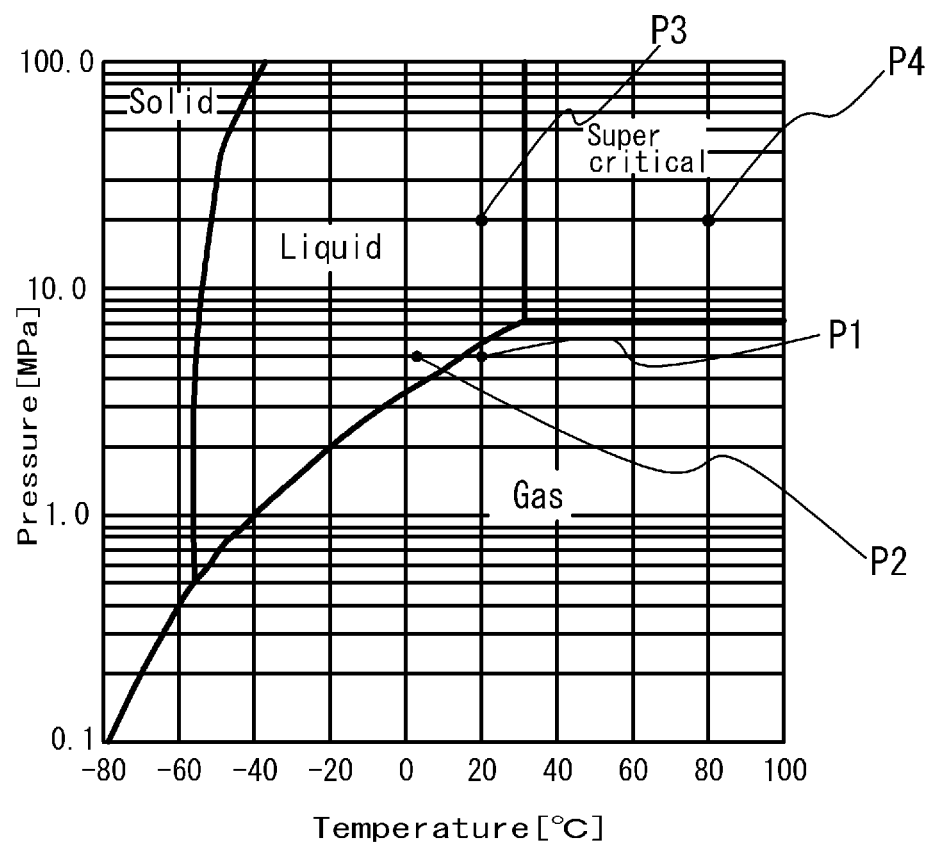

FLUID SUPPLY DEVICE AND LIQUID DISCHARGE METHOD OF THIS DEVICE

FIELD OF THE INVENTION

The present invention relates to a fluid supply device of a fluid used in a drying process or the like of various substrates, such as semiconductor substrates, photo mask glass substrates, and liquid crystal display glass substrates, and a liquid discharge method of this device.

DESCRIPTION OF THE BACKGROUND ART

A large-scale, high-density, high-performance semiconductor device is manufactured through processes such as coating, etching, rinsing, and drying after formation of resist patterns on a resist formed on a silicon wafer through exposure, development, rinsing, and drying. In particular, a resist is a polymer material sensitive to light, X-rays, electron beams, and the like. Chemical solutions such as a developer and a rinsing solution are used in the development and rinsing processes, and therefore a drying process is essential after the rinsing process.

In this drying process, when a space width between resist patterns formed on the substrate is about 90 nm or less, the problem arises that a Laplace force acts between the patterns due to an action of a surface tension (capillary force) of the chemical solution remaining between the patterns, causing the patterns to collapse. To prevent pattern collapse caused by the action of the surface tension of the chemical solution remaining between patterns, methods of using a supercritical fluid of carbon dioxide are known as a drying process to reduce the surface tension acting between the patterns (Patent Documents 1 to 4, for example).

PATENT DOCUMENTS

Patent Document 1: Japanese Laid-Open Patent Application No. 2014-22520
Patent Document 2: Japanese Laid-Open Patent Application No. 2006-294662
Patent Document 3: Japanese Laid-Open Patent Application No. 2004-335675
Patent Document 4: Japanese Laid-Open Patent Application No. 2002-33302

SUMMARY OF THE INVENTION

Problems to be Solved by the Invention

In the fluid supply device for supplying the supercritical fluid of carbon dioxide to the processing chamber, first carbon dioxide (for example, 20° C., 5.0 MPa) in a gas state from a supply source is condensed and liquefied using a condenser, stored in a tank, and pressure-fed to the processing chamber by a pump through a main pipe leading to the processing chamber (for example, 20° C., 20.0 MPa). The carbon dioxide in a liquid state fed to the processing chamber is heated (for example, 80° C., 20.0 MPa) right before the processing chamber or inside the processing chamber to form a supercritical fluid.

In such a fluid supply device as described above, when the operation of the device is stopped, the carbon dioxide in a liquid state stored in the tank is brought into contact with the atmosphere through a discharge pipe connected to the main pipe, changed to a carbon dioxide in a gas state, and discharged to the outside.

Nevertheless, the liquid stored in the tank is supplied to the pump while falling down to the main pipe by its own weight. That is, because the pump is disposed below the tank, when the liquid stored in the tank is discharged to the outside while being vaporized, the liquid remaining in the main pipe communicating the tank and the pump is brought into contact with the atmosphere and is vaporized, causing the pipe constituting the main pipe to freeze. Various devices such as switch valves, pressure sensors, and temperature sensors are installed in the main pipe connecting the tank and the pump, resulting in the problem that the freezing of the pipe could cause failure of various devices.

An object of the present invention is to provide a fluid supply device capable of preventing failure due to freezing of various devices installed in a main pipe, and a liquid discharge method suitable for this device.

Means for Solving the Problems

A fluid supply device of the present invention is a fluid supply device for supplying a fluid in a liquid state toward a processing chamber, and comprises:
  a condenser that liquefies a fluid in a gas state;
  a tank that stores the fluid liquefied by the condenser;
  a pump that pressure-feeds the liquefied fluid stored in the tank toward the processing chamber;
  a main pipe connecting the tank and the pump and transferring the liquid stored in the tank to the pump using a weight of the liquid; and
  a discharging pipe that is connected to the main pipe at a lowest position of the main pipe at one end, is opened to the atmosphere at the other end, and vaporizes and discharges the liquid in the tank and the main pipe to the outside.

The discharging pipe is formed so that, after the liquid in the tank and the main pipe is fully discharged, a liquid pool that separates a space on the atmosphere side and a space on the main pipe side of the discharging pipe is temporarily produced in the discharging pipe.

Preferably, a configuration can be adopted in which the discharging pipe has a lowest position in a middle thereof lower than positions of the one end and the other end so that the liquid pool is produced near the lowest position, and a switch valve is provided at the lowest position of the discharging pipe.

More preferably, a configuration can be adopted in which the discharging pipe is provided with an orifice on the other end side, comprises an exhaust passage connected in a vicinity of an outlet side of the orifice of the discharging pipe, and further comprises an exhaust device for causing the atmosphere to flow through the exhaust passage in one direction.

A liquid discharge method of the present invention is a liquid discharge method of a fluid supply device for supplying a fluid in a liquid state toward a processing chamber, and the fluid supply device comprises:
  a condenser that liquefies a fluid in a gas state;
  a tank that stores the fluid condensed and liquefied by the condenser;
  a pump that pressure-feeds the liquefied fluid stored in the tank toward the processing chamber; and
  a main pipe connecting the tank and the pump and transferring the liquid stored in the tank to the pump using a weight of the liquid.

The liquid discharge method comprises a step of:
  when a discharging pipe connected to the main pipe at a lowest position of the main pipe at one end and opened to the atmosphere at the other end is used to vaporize and discharge the liquid in the tank and the main pipe to the outside, temporarily producing, in the discharging pipe, a liquid pool that separates a space on the atmosphere side and a space on the main pipe side of the discharging pipe after the liquid in the tank and the main pipe is fully discharged.

A semiconductor manufacturing system of the present invention processes a substrate using the fluid supply device having the above-described configuration.

Effect of the Invention

According to the present invention, the discharging pipe is formed so that, after liquid in a tank and a main pipe is fully discharged, a liquid pool that separates a space on an atmosphere side of a discharging pipe and a space on a main pipe side is temporarily produced in the discharging pipe, and the liquid that forms the temporarily produced liquid pool is vaporized from a side that comes into contact with the atmosphere. Such vaporization may cause cooling and freezing of the discharging pipe by vaporization heat at this time, but the liquid that forms the liquid pool is not vaporized on a side that comes into contact with the space on the main pipe side, making it possible to keep the main pipe from being cooled and frozen.

BRIEF DESCRIPTION OF THE DRAWINGS

FIG. 1 is a configuration diagram of a fluid supply device according to an embodiment of the present invention, and is a diagram illustrating a state in which a fluid is supplied to a processing chamber.

FIG. 2 is a diagram illustrating a state in which a liquid is circulated in the fluid supply device of FIG. 1.

FIG. 3 is a diagram illustrating a discharge process of discharging a liquid stored in a tank of the fluid supply device of FIG. 1 to the outside.

FIG. 4 is a diagram illustrating the discharge process, continuing from FIG. 3.

FIG. 5 is a diagram illustrating the discharge process, continuing from FIG. 4.

FIG. 6 is a graph showing a state of carbon dioxide.

DESCRIPTION OF THE PREFERRED EMBODIMENTS

Embodiments of the present invention are described below with reference to the drawings.

FIG. 1 illustrates a fluid supply device according to an embodiment of the present invention. In the present embodiment, a case in which carbon dioxide is used as the fluid will be described.

In FIG. 1, 2 denotes a main pipe, 3 denotes a branch pipe, 5 denotes a discharging pipe, 100 denotes a $CO_2$ supply source, 110 denotes a switch valve, 120 denotes a filter, 130 a condenser, 140 denotes a tank, 150 denotes a switch valve, 160 denotes a pump, 170 denotes a back pressure valve, 180 denotes a switch valve, 200 denotes a switch valve, 210 denotes an orifice, 300 denotes an exhaust device, and 500 denotes a processing chamber. Further, in the drawings, PT denotes various devices such as a pressure sensor and a temperature sensor. FIG. 1 illustrates a state in which the switch valves 110, 150, 180 are opened, and the switch valve 200 is closed.

In the processing chamber 500, a semiconductor substrate such as a silicon wafer is processed. It should be noted that while, in the present embodiment, a silicon wafer is exemplified as a processing target, the processing target is not necessarily limited thereto, and may be another processing target such as a glass substrate.

The $CO_2$ supply source 100 supplies carbon dioxide (for example, 20° C., 5.0 MPa) in a gas state to the main pipe 2. With reference to a graph showing a state of carbon dioxide of FIG. 6, the carbon dioxide supplied from the $CO_2$ supply source 100 is in a state of P1 in FIG. 6. The carbon dioxide in this state is fed to the condenser 130 through the switch valve 110 and the filter 120.

In the condenser 130, the supplied carbon dioxide in a gas state is cooled and thus liquefied, and the liquefied carbon dioxide is stored in the tank 140. The carbon dioxide stored in the tank 140 is in a state (3° C., 5 MPa) such as indicated by P2 in FIG. 6. The carbon dioxide in a liquid state such as indicated by P2 in FIG. 6 is fed from a bottom portion of the tank 140 to the pump 160 through the main pipe 2 by its own weight and pressure-fed to a discharge side of the pump 160, and thus turns into a liquid state (20° C., 20 MPa) such as indicated by P3 in FIG. 6. The main pipe 2 extends from the tank 140 to the processing chamber 500 through the pump 160, and the height at which the pump 160 is connected is the lowest position of the main pipe 2.

The switch valve 180 is provided in a middle of the main pipe 2 connecting the pump 160 and the processing chamber 500. A branch pipe 3 branches from an area between the pump 160 and the switch valve 180 of the main pipe 2. The branch pipe 3 branches from the main pipe 2 between the pump 160 and the switch valve 180, and is connected to the main pipe 2 again on an upstream side of the filter 120. The back pressure valve 170 is provided to the branch pipe 3.

When a pressure of the fluid (liquid) on the discharge side of the pump 160 becomes a setting pressure (for example, 20 MPa) or greater, the back pressure valve 170 releases the liquid to the filter 120 side. Accordingly, the pressure of the liquid on the discharge side of the pump 160 is prevented from exceeding the setting pressure.

With the switch valves 110, 150, 180 opened, the carbon dioxide in a liquid state is pressure-fed to the processing chamber 500. The carbon dioxide in a liquid state thus pressure-fed is heated by heater (not illustrated) provided right before the processing chamber 500 or inside the processing chamber 500, and turns into a supercritical state (80° C., 20 MPa) such as indicated by P4 illustrated in FIG. 6.

With the switch valve 180 closed, the liquid pressure-fed from the pump 160 returns again to the condenser 130 and the tank 140 through the branch pipe 3, as illustrated in FIG. 2.

Here, the configuration and the method in which the carbon dioxide in a liquid state stored in the tank 140 is brought into contact with the atmosphere through the discharging pipe 5, changed to a carbon dioxide in a gas state, and discharged to the outside when the operation of the fluid supply device having the above-described configuration is stopped will be described with reference to FIG. 3 to FIG. 5.

As understood from the drawings, the discharging pipe 5 made of a metal such as stainless steel is configured by a plurality of piping areas 5a to 5e, and an end portion of the piping area 5a is connected at a communicating part CN1 of a lowest position MB of the main pipe 2. The piping area 5a of the discharging pipe 5 extends from the communicating part CN1 in a horizontal direction and, following this, the piping area 5b extends downward in a vertical direction. The piping area 5c is connected at one end to the piping area 5b at the lowest position of the piping area 5b, extends in the horizontal direction, and is connected at the other end to the piping area 5d extending upward in the vertical direction. An upper end portion of the piping area 5d is positioned between the lowest position MB and a lowest portion of the tank 140, and the piping area 5e connected to the piping area 5d and extending in the horizontal direction is connected to an exhaust passage 310 of the exhaust device 300.

The switch valve 200 is provided in a middle of the piping area 5c located at the lowest position.

The orifice 210 is provided to the piping area 5e, and is connected to the exhaust passage 310 at a vicinity of an outlet 211 of the orifice 210.

The exhaust device 300 includes the exhaust passage 310 extending in an up-down direction and an exhaust fan 320 provided to the exhaust passage 310. The exhaust fan 320 is driven, thereby causing an atmosphere A1 to flow through the exhaust passage 310 from a lower side toward an upper side and be exhausted from the exhaust fan 320 to the outside.

As illustrated in FIG. 3, when the switch valves 110 and 150 are closed and the switch valve 200 is opened, a liquid (carbon dioxide in a liquid state) LQ in the tank 140 fills a space of the main pipe 2 from a bottom portion of the tank 140 to the switch valve 150 and a space of the discharging pipe 5 from the communicating part CN1 to the orifice 210. In the orifice 210, the liquid LQ is vaporized by coming into contact with the atmosphere, and becomes carbon dioxide gas. This carbon dioxide gas is mixed with the atmosphere A1 flowing through the exhaust passage 310 and released to the outside through the exhaust fan 320.

At the outlet 211 of the orifice 210, heat escapes when the liquid LQ is vaporized, causing the temperature to lower. However, because the atmosphere A1 having a quantity of heat is always supplied near the outlet 211 of the orifice 210, the orifice 210 never freezes or clogs.

As illustrated in FIG. 4, when the liquid LQ in the tank 140 is fully discharged and a space in which the liquid LQ does not exist is formed on the tank 140 side of the main pipe 2, a space in which the liquid LQ does not exist is formed on the orifice 210 side of the discharging pipe 5 as well, and a liquid level of the liquid LQ on the orifice 210 side is also lowered. It should be noted that a closed space from the tank 140 to the main pipe 2 where the liquid LQ does not exist is filled with carbon dioxide gas having a pressure higher than the atmospheric pressure, and therefore the liquid level of the liquid LQ on the main pipe 2 side becomes lower than the liquid level of the liquid LQ on the orifice 210 side in the state illustrated in FIG. 4. At this time, a liquid surface of the liquid LQ on the orifice 210 side comes into contact with the atmosphere A1 that enters through the orifice 210 thereof, and therefore the liquid LQ is vaporized in the piping area 5d. Thus, as illustrated in FIG. 4, there is a possibility that a frozen area FZ occurs in a portion of the piping areas 5d and 5e.

Nevertheless, the frozen area FZ is separated from the main pipe 2, and therefore does not affect the main pipe 2.

When the discharge of the liquid LQ further proceeds from the state illustrated in FIG. 4, a liquid pool of the liquid LQ is formed by the piping areas 5b, 5c, 5d, as illustrated in FIG. 5. At this time, the frozen area FZ may expand to the piping area 5c in addition to the piping areas 5e, 5d. Even in this state, the main pipe side of the liquid LQ forming the liquid pool is in contact with the carbon dioxide gas having a pressure higher than the atmospheric pressure at a liquid surface thereof and is not vaporized, and thus the frozen area FZ only expands to the piping area 5b in a worst case scenario. When the liquid LQ forming the liquid pool is fully vaporized in the piping area 5c, discharge of the liquid is completed. That is, it is possible to reliably prevent the frozen area FZ from expanding to the main pipe 2 by temporarily forming a liquid pool in the piping area 5c.

As described above, according to the present embodiment, it is possible to reliably prevent the main pipe 2 used for fluid supply when the fluid supply device is operated from freezing by the vaporization heat when the carbon dioxide in a liquid state comes into contact with the atmosphere and vaporizes.

While a configuration in which the liquid pool is produced by the piping areas 5b, 5c, 5d has been described as an example in the above-described embodiment, the present invention is not necessarily limited thereto and a curving U-shaped portion may be formed in the discharging pipe 5 or a bent portion may be formed so as to allow liquid pool formation.

While a case of using carbon dioxide as the fluid is illustrated in the above-described embodiment, the present invention is not necessarily limited thereto and is applicable as long as the fluid can be changed to a supercritical state.

DESCRIPTIONS OF REFERENCE NUMERALS

2 Main pipe
3 Branch pipe
5 Discharging pipe
100 $CO_2$ supply source
110 Switch valve
120 Filter
130 Condenser
140 Tank
150 Switch valve
160 Pump
170 Back pressure valve
180 Switch valve
200 Switch valve
210 Orifice
300 Exhaust device
310 Exhaust passage
320 Exhaust fan
500 Processing chamber
CN1 Communicating part
MB Lowest position

What is claimed is:

1. A fluid supply device for supplying a fluid in a liquid state toward a processing chamber, comprising:
   a condenser that liquefies a fluid in a gas state;
   a tank that stores the fluid liquefied by the condenser;
   a pump that pressure-feeds the liquefied fluid stored in the tank toward the processing chamber;
   a main pipe connecting the tank and the pump and transferring the liquefied fluid stored in the tank to the pump using a weight of the liquefied fluid; and
   a discharging pipe that is connected to the main pipe at a lowest position of the main pipe at one end, is opened to an atmosphere at another end, and vaporizes and discharges the liquefied fluid in the tank and the main pipe to an outside,
   the discharging pipe being formed so that, after the liquefied fluid in the tank and the main pipe is fully discharged, a liquid pool that separates a space on an atmosphere side and a space on a main pipe side of the discharging pipe is temporarily produced in the discharging pipe.

2. The fluid supply device according to claim 1, wherein the discharging pipe has a lowest position in a middle thereof lower than positions of the one end and the another end so that the liquid pool is produced at and adjacent the lowest position, and a switch valve is provided at the lowest position of the discharging pipe.

3. The fluid supply device according to claim 1, wherein the discharging pipe is provided with an orifice on a side of the another end, comprises an exhaust passage connected in a vicinity of an outlet side of the orifice of the discharging pipe, and further comprises an exhaust device to cause the atmosphere to flow through the exhaust passage in one direction.

4. The fluid supply device according to claim 1, wherein the fluid includes carbon dioxide.

5. A liquid discharge method of a fluid supply device for supplying a fluid in a liquid state toward a processing chamber, the fluid supply device comprising:
   a condenser that liquefies a fluid in a gas state;
   a tank that stores the fluid liquefied by the condenser;
   a pump that pressure-feeds the liquefied fluid stored in the tank toward the processing chamber; and
   a main pipe connecting the tank and the pump and transferring the liquefied fluid stored in the tank to the pump using a weight of the liquefied fluid,
   the liquid discharge method comprising:
   when a discharging pipe connected to the main pipe at a lowest position of the main pipe at one end and opened to an atmosphere at another end is used to vaporize and discharge the liquefied fluid in the tank and the main pipe to an outside, temporarily producing, in the discharging pipe, a liquid pool that separates a space on an atmosphere side and a space on a main pipe side of the discharging pipe after the liquefied fluid in the tank and the main pipe is fully discharged.

6. The liquid discharge method according to claim 5, further comprising:
   causing the atmosphere to flow through an exhaust passage in one direction;
   mixing the gas obtained by vaporizing the liquefied fluid and the atmosphere to obtain a mixture; and
   discharging the mixture to the outside, wherein
   the discharging pipe is provided with an orifice on a side of said another end, and
   the exhaust passage is connected in a vicinity of an outlet side of the orifice of the discharging pipe.

7. A semiconductor manufacturing system comprising:
   the fluid supply device described in claim 1; and
   a processing chamber that processes a substrate using the fluid supplied from the fluid supply device.

* * * * *